(12) United States Patent
Park et al.

(10) Patent No.: US 10,229,790 B2
(45) Date of Patent: Mar. 12, 2019

(54) COMPOSITE ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Sang Soo Park, Suwon-Si (KR); Kyoung Jin Jun, Suwon-Si (KR); Young Ghyu Ahn, Suwon-Si (KR); Heung Kil Park, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 8 days.

(21) Appl. No.: 14/869,935

(22) Filed: Sep. 29, 2015

(65) Prior Publication Data

US 2016/0133386 A1 May 12, 2016

(30) Foreign Application Priority Data

Nov. 10, 2014 (KR) .................. 10-2014-0155179

(51) Int. Cl.
*H01G 4/30* (2006.01)
*H01G 2/06* (2006.01)
(Continued)

(52) U.S. Cl.
CPC .............. *H01G 4/40* (2013.01); *H01G 2/06* (2013.01); *H01G 4/12* (2013.01); *H01G 4/228* (2013.01);
(Continued)

(58) Field of Classification Search
CPC ............. H01G 4/30; H01G 4/228; H01G 2/06
(Continued)

(56) References Cited

U.S. PATENT DOCUMENTS 6,002,168 A * 12/1999 Bellaar ............ H01L 23/49816
257/693
9,313,892 B2 4/2016 Hattori et al.
(Continued)

FOREIGN PATENT DOCUMENTS

JP 04096310 A * 3/1992
JP 2001291948 A * 10/2001
(Continued)

OTHER PUBLICATIONS

Ulrich et al., Comparison of Paraelectric and Ferroelectric Materials for Applications as Dielectrics in Thin Film Integrated Capacitors, 2000, The International Journal of Microcircuits and Electronic Packaging, vol. 23, No. 2, Second Quarter 2000.*
(Continued)

*Primary Examiner* — Eric W Thomas
(74) *Attorney, Agent, or Firm* — Morgan Lewis & Bockius LLP

(57) ABSTRACT

A composite electronic component includes a composite body in which a multilayer ceramic capacitor and a ceramic electronic component are coupled to each other. The multilayer ceramic capacitor includes a first ceramic body comprising dielectric layers and internal electrodes, the internal electrodes having at least one of the dielectric layers interposed therebetween; and first and second external electrodes disposed on first and second end portions of the first ceramic body. The ceramic electronic component includes a second ceramic body coupled to a lower portion of the multilayer ceramic capacitor and made of ceramic; and first and second terminal electrodes disposed on first and second end portions of the second ceramic body and connected to the first and second external electrodes, and the multilayer ceramic capacitor and the ceramic electronic component have different lengths.

14 Claims, 17 Drawing Sheets

(51) Int. Cl.
*H01G 4/228* (2006.01)
*H01G 4/40* (2006.01)
*H05K 3/30* (2006.01)
*H05K 3/34* (2006.01)
*H01G 4/12* (2006.01)
*H05K 3/32* (2006.01)

(52) U.S. Cl.
CPC ............... *H01G 4/30* (2013.01); *H05K 3/301* (2013.01); *H05K 3/3431* (2013.01); *H05K 3/321* (2013.01); *H05K 3/3442* (2013.01); *H05K 2201/10015* (2013.01); *H05K 2201/10636* (2013.01); *H05K 2201/10651* (2013.01); *H05K 2201/2045* (2013.01); *H05K 2203/0465* (2013.01); *Y02P 70/611* (2015.11); *Y02P 70/613* (2015.11)

(58) Field of Classification Search
USPC .............................. 361/301.6, 306.3, 301.4
See application file for complete search history.

(56) References Cited

U.S. PATENT DOCUMENTS

| | | | |
|---|---|---|---|
| 2004/0066589 A1 | 4/2004 | Togashi et al. | |
| 2007/0165361 A1* | 7/2007 | Randall | H01G 4/30 361/306.3 |
| 2013/0033836 A1 | 2/2013 | Hattori et al. | |
| 2013/0284507 A1* | 10/2013 | Hattori | H05K 1/18 174/260 |
| 2014/0182910 A1 | 7/2014 | Ahn et al. | |
| 2014/0284089 A1* | 9/2014 | Hattori | H05K 1/141 174/258 |
| 2015/0022945 A1 | 1/2015 | Park et al. | |
| 2015/0026973 A1* | 1/2015 | Ogawa | H05K 3/0052 29/832 |
| 2015/0206661 A1* | 7/2015 | Fujimura | H01G 4/30 361/301.4 |
| 2015/0270065 A1* | 9/2015 | Hattori | H01G 2/065 174/255 |

FOREIGN PATENT DOCUMENTS

| | | | |
|---|---|---|---|
| JP | 2004134430 A | 4/2004 | |
| JP | 5012658 B2 | 6/2012 | |
| JP | 2013038144 A | 2/2013 | |
| JP | 2014-207422 A | 10/2014 | |
| KR | 10-2010-0048044 A | 5/2010 | |
| KR | 10-2014-0088366 A | 7/2014 | |
| KR | 10-1434108 B1 | 8/2014 | |

OTHER PUBLICATIONS

Office Action issued in corresponding Korean Patent Application No. 10-2014-0155179, dated Aug. 28, 2018.
Office Action issued in corresponding Korean Patent Application No. 10-2014-0155179, dated Dec. 26, 2018.
Korean Office Action dated Dec. 26, 2018 issued in Korean Patent Application No. 10-2014-0155179 (with English translation).

* cited by examiner

COMPOSITE ELECTRONIC COMPONENT AND BOARD HAVING THE SAME

CROSS-REFERENCE TO RELATED APPLICATION

This application claims the benefit of priority to Korean Patent Application No. 10-2014-0155179, filed on Nov. 10, 2014 with the Korean Intellectual Property Office, the entirety of which is incorporated herein by reference.

BACKGROUND

The present disclosure relates to a composite electronic component, a board having the same, and a packing unit therefor.

A multilayer ceramic capacitor (MLCC), a multilayer electronic component, is a type of capacitor mounted on the printed circuit boards of various electronic products including display devices such as liquid crystal displays (LCDs) and plasma display panels (PDPs), computers, smartphones, mobile phones, and the like, to serve to charge and discharge electricity therein.

Since a multilayer ceramic capacitor has advantages such as small size, high capacitance, and ease of mounting, it may be used as a component in various electronic devices.

The multilayer ceramic capacitor may have a structure in which a plurality of dielectric layers and internal electrodes having different polarities are alternately stacked.

Since the dielectric layers have piezoelectric and electrostrictive properties, a piezoelectric phenomenon occurs between the internal electrodes when a direct current (DC) voltage or alternating current (AC) voltage is applied to the multilayer ceramic capacitor, and thus vibrations may be generated.

These vibrations are transferred to a circuit board on which the multilayer ceramic capacitor is mounted, through external electrodes of the multilayer ceramic capacitor, so that the overall circuit board becomes an acoustic reflective surface that may generate a vibration sound.

The vibration sound may be within an audio frequency range of 20 to 20,000 Hz, which may cause listener discomfort and is referred to as acoustic noise.

In accordance with the recent trend toward compactness and slimness of electronic devices, multilayer ceramic capacitors have been used together with printed circuit boards in environments in which high voltages are used and changes in voltage frequently occur, and thus, levels of acoustic noise may be increased so that the acoustic noise may be audible to users.

Therefore, there is a growing demand for a novel product capable of decreasing acoustic noise.

SUMMARY

An aspect of the present disclosure may provide a composite electronic component capable of decreasing acoustic noise, a board having the same, and a packing unit therefor.

According to an aspect of the present disclosure, a composite electronic component comprises a composite body in which a multilayer ceramic capacitor and a ceramic electronic component are coupled to each other, wherein the multilayer ceramic capacitor includes a first ceramic body comprising dielectric layers and internal electrodes, the internal electrodes having at least one of the dielectric layers interposed therebetween; and first and second external electrodes disposed on first and second end portions of the first ceramic body, the ceramic electronic component comprises a second ceramic body coupled to a lower portion of the multilayer ceramic capacitor and made of ceramic; and first and second terminal electrodes disposed on first and second end portions of the second ceramic body and connected to the first and second external electrodes, and the multilayer ceramic capacitor and the ceramic electronic component have different lengths.

The ceramic may contain a paraelectric material.

The ceramic may contain alumina ($Al_2O_3$).

The internal electrodes may be perpendicular to a mounting surface of the composite body.

The multilayer ceramic capacitor and the ceramic electronic component may be coupled to each other by a conductive adhesive disposed on lower surfaces of the first and second external electrodes.

The multilayer ceramic capacitor and the ceramic electronic component may be coupled to each other by an insulating adhesive disposed on a lower surface of the first ceramic body and an upper surface of the second ceramic body.

The first and second terminal electrodes may have a double layer structure including a conductive resin layer disposed on the ceramic body and a plating layer disposed on the conductive resin layer.

The conductive resin layer may contain silver (Ag) and an epoxy resin.

The ceramic electronic component may be longer than the multilayer ceramic capacitor.

The ceramic electronic component may be wider than the multilayer ceramic capacitor.

The ceramic electronic component may be shorter than the multilayer ceramic capacitor.

The ceramic electronic component is shorter than the multilayer ceramic capacitor, and the ceramic electronic component is narrower than the multilayer ceramic capacitor.

According to another aspect of the present disclosure, a board comprises a printed circuit board having a plurality of electrode pads; a composite electronic component mounted on the printed circuit board; and solders connecting the electrode pads and the composite electronic component to each other, wherein the composite electronic component includes a composite body in which a multilayer ceramic capacitor and a ceramic electronic component are coupled to each other, the multilayer ceramic capacitor includes a first ceramic body comprising dielectric layers and internal electrodes, the internal electrodes having at least one of the dielectric layers interposed therebetween; and first and second external electrodes disposed on first and second end portions of the first ceramic body, the ceramic electronic component comprises a second ceramic body coupled to a lower portion of the multilayer ceramic capacitor and made of ceramic; and first and second terminal electrodes disposed on first and second end portions of the second ceramic body and connected to the first and second external electrodes, and the multilayer ceramic capacitor and the ceramic electronic component have different lengths.

The solders may be disposed on side surfaces of the first and second terminal electrodes and lower portions of the first and second external electrodes.

BRIEF DESCRIPTION OF DRAWINGS

The above and other aspects, features, and advantages of the present disclosure will be more clearly understood from the following detailed description taken in conjunction with the accompanying drawings.

DETAILED DESCRIPTION

Figure 1:
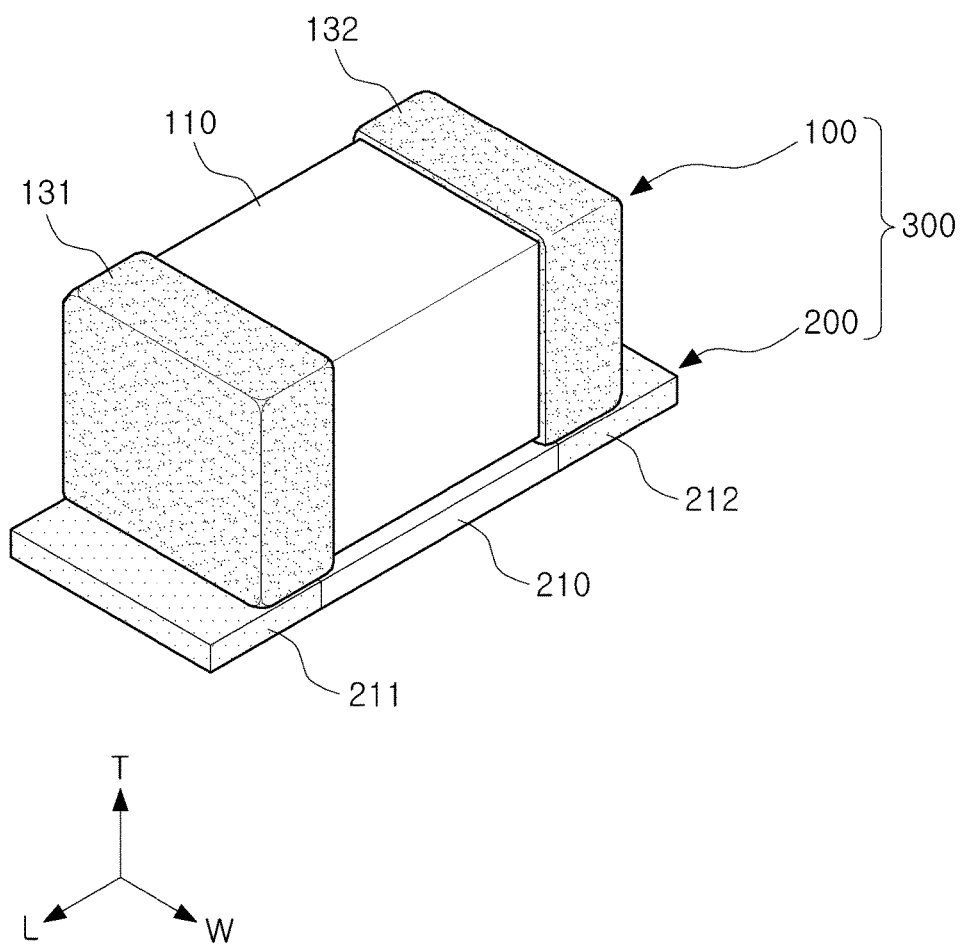
FIG. 1 is a perspective view schematically illustrating a composite electronic component according to an exemplary embodiment in the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Composite Electronic Component

FIG. 1 is a perspective view schematically illustrating a composite electronic component according to an exemplary embodiment.

Figure 2:
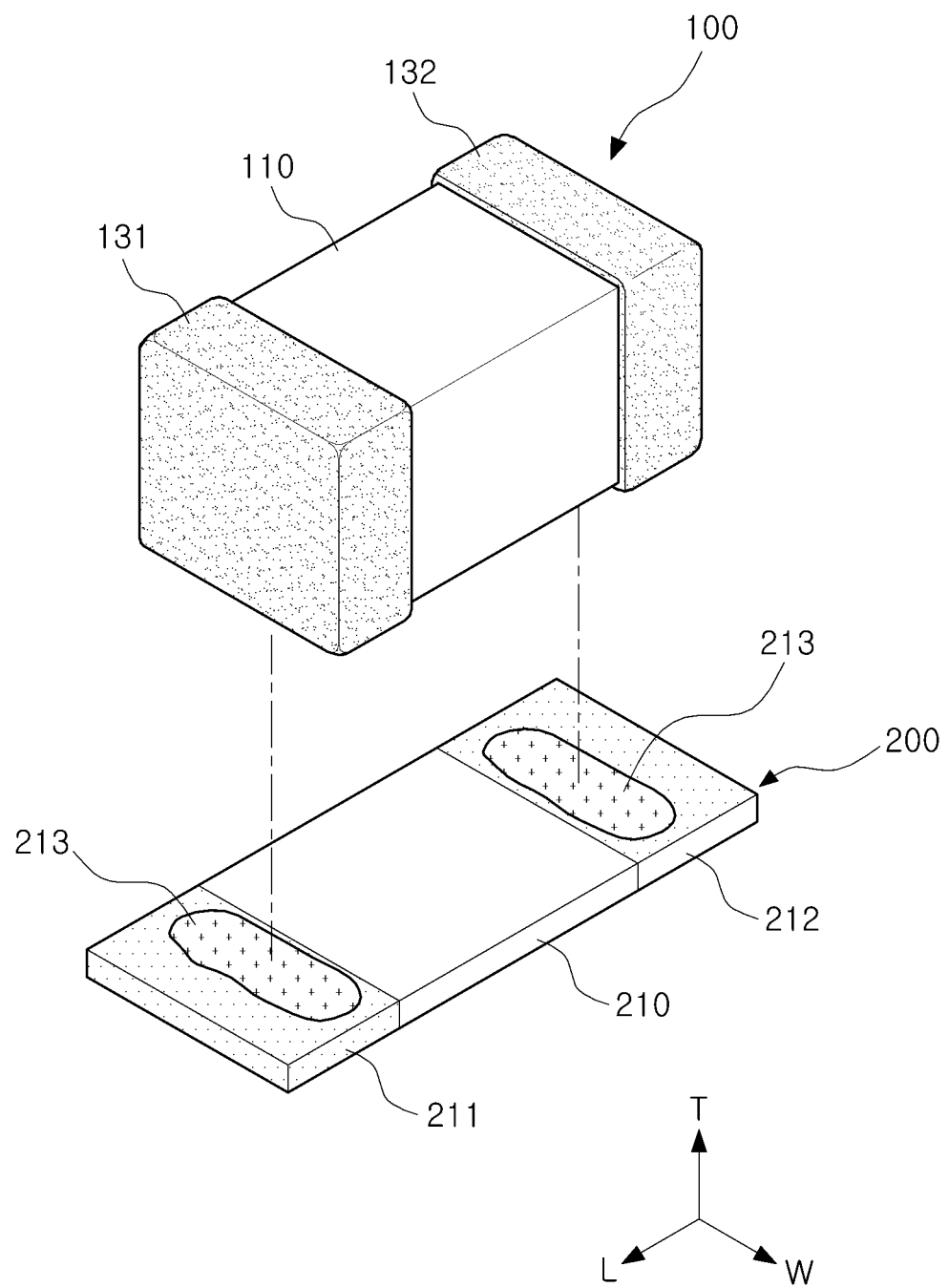
FIG. 2 is an exploded perspective view illustrating a multilayer ceramic capacitor and a ceramic electronic component of the composite electronic component of FIG. 1.

FIG. 2 is an exploded perspective view illustrating a multilayer ceramic capacitor and a ceramic electronic component of the composite electronic component of FIG. 1.

With respect to directions of the composite electronic component, according to exemplary embodiments in the present disclosure, a 'length direction' refers to an 'L' direction of FIG. 1, a 'width direction' refers to a 'W' direction of FIG. 1, and a 'thickness direction' refers to a 'T' direction of FIG. 1.

In one exemplary embodiment, the composite electronic component may have upper and lower surfaces in the thickness direction opposing each other, first and second end surfaces in the length direction opposing each other, and first and second side surfaces in the width direction opposing each other, and the end surfaces and the side surfaces connect the upper and lower surfaces to each other. A shape of the composite electronic component is not particularly limited, but may be hexahedral as shown.

In addition, the first and second end surfaces of the composite electronic component in the length direction and the first and second side surfaces thereof in the width direction are surfaces in the same directions as directions of first and second end surfaces of the multilayer ceramic capacitor and the ceramic electronic component in the length direction and first and second side surfaces of the multilayer ceramic capacitor and the ceramic electronic component in the width direction, respectively, as described below.

Meanwhile, the multilayer ceramic capacitor and the ceramic electronic component may be bonded to each other to form the composite electronic component. In a case in which the ceramic electronic component is bonded to a lower portion of the multilayer ceramic capacitor, the upper surface of the composite electronic component is an upper surface of the multilayer ceramic capacitor, and a lower surface of the composite electronic component is a lower surface of the ceramic electronic component.

Referring to FIGS. 1 and 2, the composite electronic component, according to an exemplary embodiment, may include a composite body 300 in which a multilayer ceramic capacitor 100 and a ceramic electronic component 200 are bonded to each other. The multilayer ceramic capacitor 100 may include a first ceramic body 110 having a plurality of dielectric layers and internal electrodes. The internal electrodes are disposed to face each other with at least one of the dielectric layers interposed therebetween. First and second external electrodes 131 and 132 are disposed on both end portions of the first ceramic body 110. The ceramic electronic component 200 includes a second ceramic body 210 disposed on the lower surface of the multilayer ceramic capacitor 100 and formed of ceramic, and first and second terminal electrodes 211 and 212 disposed on both end portions of the second ceramic body 210 and connected to the first and second external electrodes 131 and 132.

In the present exemplary embodiment, the composite body 300 may be formed by coupling the multilayer ceramic capacitor 100 and the ceramic electronic component 200 to each other, and a method of forming the composite body 300 is not particularly limited.

For example, as illustrated in FIG. 2, the composite body 300 may be formed by coupling the multilayer ceramic capacitor 100 and the ceramic electronic component 200, which are separately manufactured, by using a high-melting point solder, a conductive adhesive 213, or the like.

The conductive adhesive 213 may be a paste containing a conductive metal and an epoxy resin, but is not necessarily limited thereto.

When the multilayer ceramic capacitor 100 and the ceramic electronic component 200 are bonded using the high-melting point solder, the conductive adhesive 213, or the like, the conductive adhesive 213 may be applied onto lower surfaces of the first and second external electrodes 131 and 132 to thereby be adhered to the first and second terminal electrodes 211 and 212 of the ceramic electronic component 200.

The high-melting point solder or the conductive adhesive 213 may be applied onto the lower surfaces of the first and second external electrodes 131 and 132 to thereby be fixed to the ceramic electronic component 200 at the lower surface of the multilayer ceramic capacitor 100, such that only vibrations of a length-width surface (LW surface) of the first ceramic body 110 may be transferred to the ceramic electronic component 200.

Therefore, the transferring of stress and vibrations generated in the multilayer ceramic capacitor may be significantly decreased, such that acoustic noise may be decreased.

Figure 3:
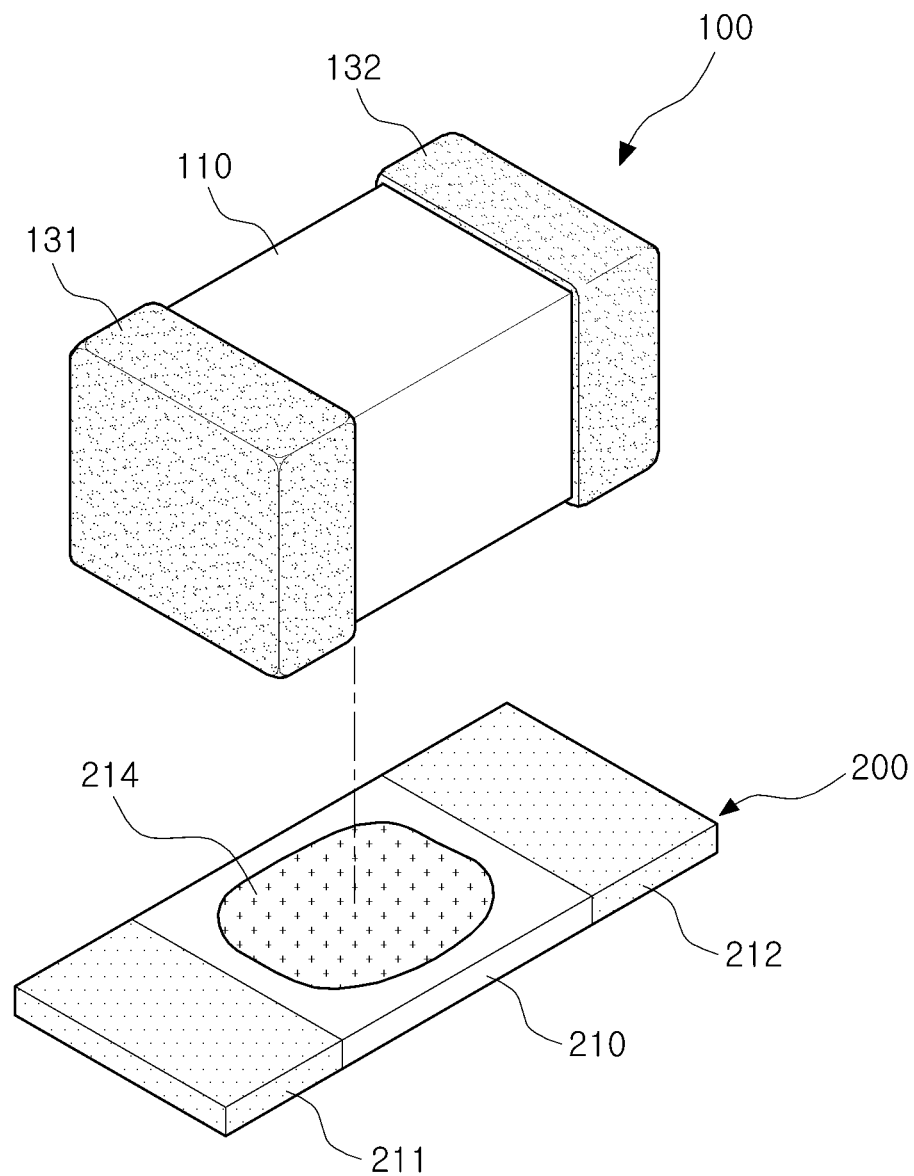
FIG. 3 is an exploded perspective view illustrating a multilayer ceramic capacitor and a ceramic electronic component in another example of the composite electronic component of FIG. 1.

FIG. 3 is an exploded perspective view illustrating a multilayer ceramic capacitor and a ceramic electronic component in another example of the composite electronic component of FIG. 1.

Referring to FIG. 3, as another example of the composite electronic component, the multilayer ceramic capacitor 100 and the ceramic electronic component 200 may be bonded to each other by an insulating adhesive 214 applied between the lower surface of the first ceramic body 110 of the multilayer ceramic capacitor 100 and the upper surface of the second ceramic body 210 of the ceramic electronic component 200.

The insulating adhesive 214 may be applied to ceramic portions of the lower surface of the first ceramic body 110 and the upper surface of the second ceramic body 210 on which the first and second external electrodes and the first and second terminal electrodes are not disposed.

The insulating adhesive 214 is not particularly limited, but may be, for example, an epoxy resin.

Hereinafter, the multilayer ceramic capacitor 100 and the ceramic electronic component 200 configuring the composite body 300 will be described in detail.

Figure 4:
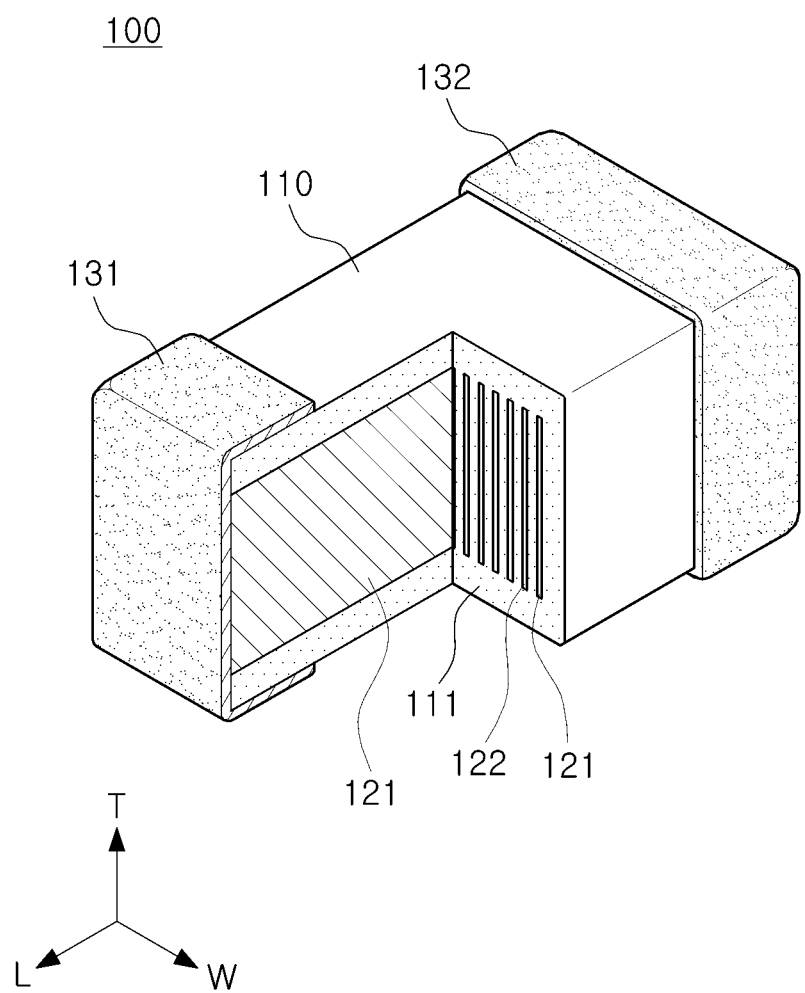
FIG. 4 is a partially cut-away perspective view schematically illustrating the multilayer ceramic capacitor of the composite electronic component of FIG. 1.

FIG. 4 is a partially cut-away perspective view schematically illustrating the multilayer ceramic capacitor of the composite electronic component of FIG. 1.

Referring to FIG. 4, the first ceramic body 110 of the multilayer ceramic capacitor 100 may be formed by stacking a plurality of dielectric layers 111, and a plurality of first and second internal electrodes 121 and 122 may be separated by each of the dielectric layers 111 interposed therebetween in the interior of the first ceramic body 110.

The plurality of dielectric layers 111 forming the first ceramic body 110 may be in a sintered state, and adjacent dielectric layers may be integrated with each other so that boundaries therebetween are not readily apparent.

The dielectric layer 111 may be formed by sintering ceramic green sheets containing ceramic powder, an organic solvent, and an organic binder. The ceramic powder, which is a material having high permittivity, may be a barium titanate ($BaTiO_3$) based material, a strontium titanate ($SrTiO_3$) based material, or the like, but is not limited thereto.

That is, the dielectric layers 111 forming the first ceramic body 110 may contain a ferroelectric material, but is not necessarily limited thereto.

Meanwhile, according to an exemplary embodiment, the plurality of internal electrodes may include the first internal electrodes 121 exposed to the first end surface of the composite body 300 in the length direction and the second internal electrodes 122 exposed to the second end surface thereof in the length direction, but are not limited thereto.

The first and second internal electrodes 121 and 122 may be formed of a conductive paste containing a conductive metal.

The conductive metal may be nickel (Ni), copper (Cu), palladium (Pd), or an alloy thereof, but is not limited thereto.

The first and second internal electrodes 121 and 122 may be printed on the ceramic green sheets forming the dielectric layers 111, by using the conductive paste through a screen printing method or a gravure printing method.

The ceramic green sheets on which the internal electrodes are printed may be alternately stacked and sintered, thereby forming the ceramic body.

The plurality of first and second internal electrodes 121 and 122 may be disposed perpendicularly to the upper and lower surfaces of the first ceramic body 110.

That is, the first and second internal electrodes 121 and 122 may be stacked in a direction perpendicular to a mounting surface of the composite body 300 when the composite body 300 is mounted on a printed circuit board.

In general, when voltage is applied to a multilayer ceramic capacitor, a ceramic body may be repeatedly expanded and contracted in length, width, and thickness directions due to an inverse piezoelectric effect of dielectric layers.

That is, in a case in which amounts of displacement of a length-width surface (LW surface), a width-thickness surface (WT surface), and a length-thickness surface (LT surface) of the ceramic body are measured using a laser Doppler vibrometer, the amounts of displacement are decreased in order of the LW surface, the WT surface, and the LT surface.

The amount of displacement of the LT surface as compared to the amount of displacement of the WT surface is about 42%, and the amount of displacement of the LT surface is smaller than that of the WT surface. This may be due to the fact that when the same amounts of stress are generated in the LT and WT surfaces, the LT surface has a relatively large area as compared to the WT surface, and thus, stress may be distributed across the larger area and relatively small deformations may be generated.

Therefore, it may be appreciated that in general multilayer ceramic capacitors, the lowest amount of displacement is generated in the LT surface.

That is, according to the exemplary embodiment, the first and second internal electrodes 121 and 122 may be stacked perpendicularly to the upper and lower surfaces of the first ceramic body 110, such that when the composite body 300 is mounted on the printed circuit board, the first and second internal electrodes 121 and 122 may be disposed perpendicularly to the mounting surface, thereby significantly decreasing the amount of vibrations in a surface of the first ceramic body 110 in contact with the ceramic electronic component 200.

Meanwhile, the first and second external electrodes 131 and 132 may be formed of a conductive paste including a conductive metal, and the conductive metal may be nickel (Ni), copper (Cu), palladium (Pd), gold (Au), or an alloy thereof, but is not limited thereto.

Further, nickel/tin (Ni/Sn) plating layers may be further disposed on the first and second external electrodes 131 and 132.

According to an exemplary embodiment, the ceramic electronic component 200 may be bonded to the lower portion of the multilayer ceramic capacitor 100.

The ceramic electronic component 200 may have the first and second terminal electrodes 211 and 212 which are disposed on both end portions of the second ceramic body 210 formed of bulk shaped ceramic so as to be connected to the first and second external electrodes 131 and 132.

In general, in order to significantly decrease the transfer of vibrations of a multilayer ceramic capacitor to a printed circuit board, an intermediate medium may be inserted between the multilayer ceramic capacitor and the printed circuit board.

However, since the intermediate medium is formed of a material having elasticity, such as a resin generally used to manufacture aboard, the intermediate medium may serve to absorb vibrations of the multilayer ceramic capacitor because of the elasticity of the intermediate medium.

Conversely, in the exemplary embodiment, because the second ceramic body 210 of the ceramic electronic component 200 is formed of hard ceramic material that is not elastically deformable, the printed circuit board and the multilayer ceramic capacitor 100 may be spaced apart from each other by the ceramic electronic component 200, thereby preventing vibrations generated in the multilayer ceramic capacitor 100 from being transferred to the printed circuit board.

The ceramic may contain a paraelectric material.

Since the paraelectric material does not have piezoelectric properties, the paraelectric material may suppress the transfer of vibrations generated in the multilayer ceramic capacitor 100, such that the ceramic electronic component 200 containing the paraelectric material is disposed on the lower portion of the multilayer ceramic capacitor 100 to decrease acoustic noise.

The paraelectric material is not particularly limited as long as it has paraelectric properties. For example, the paraelectric material may be a material represented by $(Ca_{1-x}Sr_x)$ $(Zr_{1-y}Ti_y)O_3$, $Ca(Zr_{1-y}Ti_y)O_3$, $Sr(Zr_{1-y}Ti_y)O_3$, $(Ca_{1-x}Sr_x)ZrO_3$, and $(Ca_{1-x}Sr_x)TiO_3$.

Further, the ceramic may contain alumina ($Al_2O_3$).

The second ceramic body 210 may be manufactured using the ceramic containing alumina ($Al_2O_3$), thereby suppressing the transfer of vibrations generated in the multilayer ceramic capacitor 100, similarly to a case in which the second ceramic body 210 is manufactured using the paraelectric material.

The first and second terminal electrodes 211 and 212 may have a double layer structure in which first and second conductive layers are disposed in inner portions thereof and first and second plating layers are disposed in outer portions thereof.

According to an exemplary embodiment, since the first and second terminal electrodes 211 and 212 have the double layer structure including the first and second conductive layers in the inner portions thereof and the first and second plating layers in the outer portions thereof, when mechanical stress is applied thereto, the ceramic electronic component 200 and the conductive resin layers used as the terminal electrodes 211 and 212 of the ceramic electronic component 200 may suppress stress from being transferred to the multilayer ceramic capacitor 100, thereby preventing the multilayer ceramic capacitor from being damaged by cracks.

The first and second conductive resin layers may contain a conductive metal and a thermosetting resin such as silver (Ag) and an epoxy resin, but are not limited thereto.

Figure 5A:
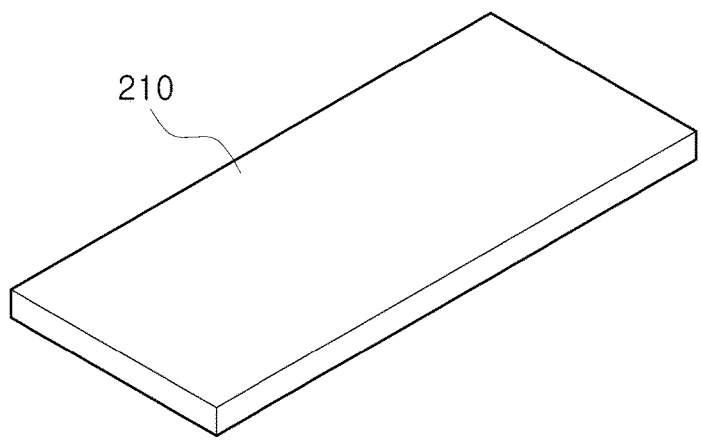
FIGS. 5A through 5C are perspective views illustrating a manufacturing process of a ceramic electronic component of the composite electronic component of FIG. 1.
Figure 5B:
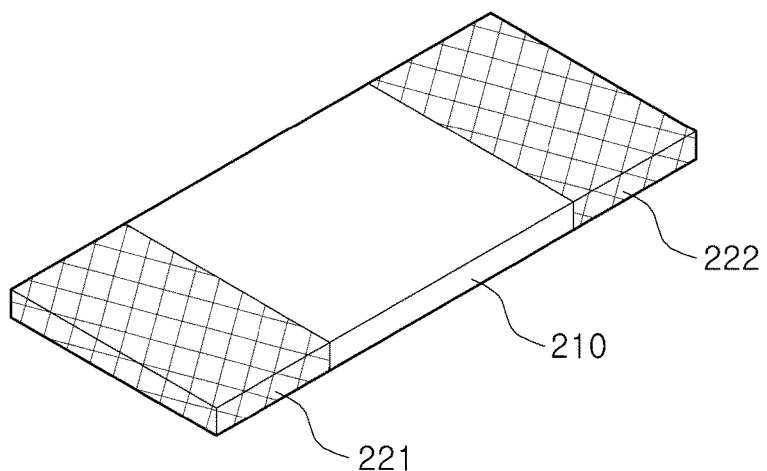
Figure 5C:
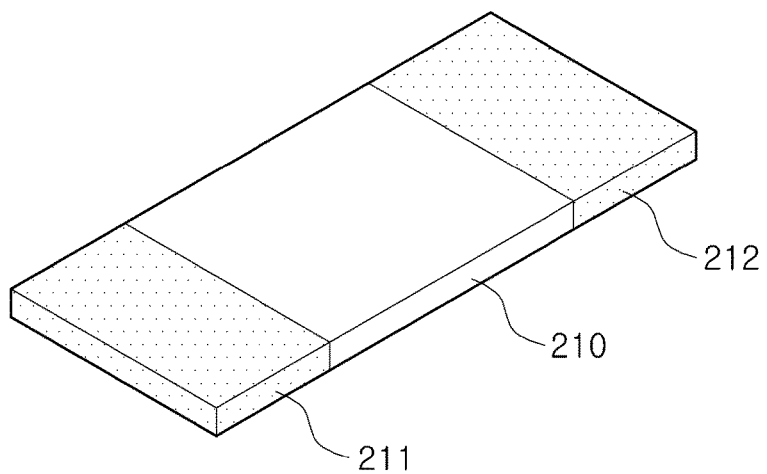

FIGS. 5A through 5C are perspective views illustrating a manufacturing process of the ceramic electronic component of the composite electronic component of FIG. 1.

Referring now to FIGS. 5A through 5C, in the ceramic electronic component 200 included in the composite electronic component, the second ceramic body 210 formed of bulk shaped ceramic may be prepared (FIG. 5A).

The ceramic may contain a paraelectric material or alumina ($Al_2O_3$).

Next, first and second conductive resin layers 221 and 222 may be formed by applying a conductive resin paste to both end portions of the second ceramic body 210 (FIG. 5B). The conductive resin paste may contain a conductive metal and a thermosetting resin.

For example, the conductive resin paste may contain silver (Ag) as the conductive metal and an epoxy resin as the thermosetting resin.

Then, first and second plating layers 211 and 212 may be formed on the first and second conductive resin layers 221 and 222 by performing nickel plating and tin plating thereon (FIG. 5C).

According to an exemplary embodiment, lengths of the multilayer ceramic capacitor 100 and the ceramic electronic component 200 may be different from each other.

By manufacturing the multilayer ceramic capacitor 100 and the ceramic electronic component 200 to have different lengths, in a manner such that the ceramic electronic component 200 is longer than the multilayer ceramic capacitor 100, even when a large amount of solder is used at the time of mounting the composite electronic component on the printed circuit board, the spreading of solder around the first and second external electrodes 131 and 132 of the multilayer ceramic capacitor 100 may be prevented, which may prevent piezoelectric stress from being directly transferred from the multilayer ceramic capacitor 100 to the printed circuit board through the first and second external electrodes 131 and 132. Therefore, acoustic noise may be further decreased.

That is, when the ceramic electronic component 200 is longer than the multilayer ceramic capacitor 100, a step portion may be formed between the ceramic electronic component 200 and the multilayer ceramic capacitor 100, and the step portion may serve to block the solder formed in the thickness direction of the ceramic electronic component 200 from spreading to the multilayer ceramic capacitor 100.

Therefore, the transfer of vibrations to the board through the solder may be significantly reduced.

Figure 6:
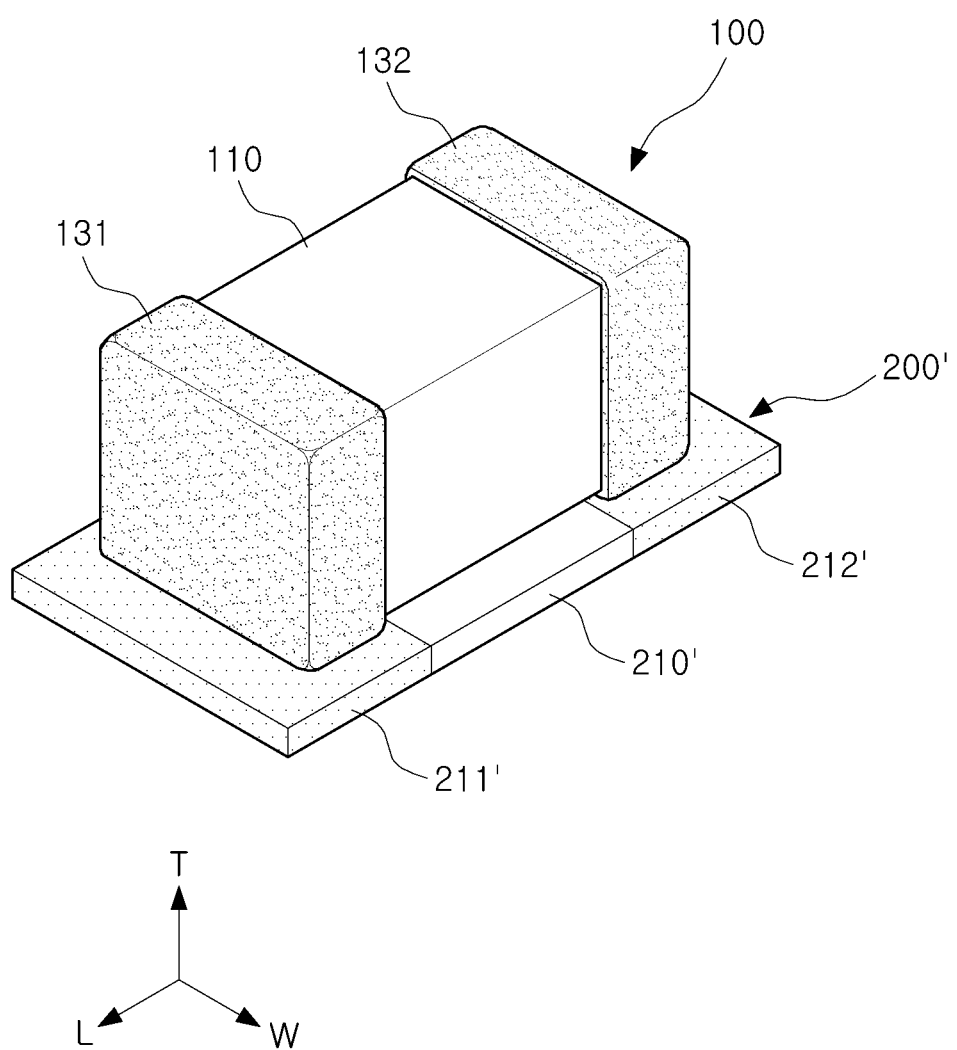
FIG. 6 is a perspective view schematically illustrating a composite electronic component according to another exemplary embodiment in the present disclosure.

FIG. 6 is a perspective view schematically illustrating a composite electronic component according to another exemplary embodiment in the present disclosure.

Referring to FIG. 6, in the composite electronic component, according to another exemplary embodiment, a ceramic electronic component 200' may be longer than the multilayer ceramic capacitor 100, and the ceramic electronic component 200' may be wider than the multilayer ceramic capacitor 100.

The ceramic electronic component 200' may include a second ceramic body 210' formed of ceramic and first and second terminal electrodes 211' and 212' disposed on both end portions of the second ceramic body 210' and connected to the first and second external electrodes 131 and 132.

Since the ceramic electronic component 200' is longer than the multilayer ceramic capacitor 100, and the ceramic electronic component 200' is wider than the multilayer ceramic capacitor 100, when the composite electronic component is mounted on a printed circuit board, the ceramic electronic component 200' may serve to prevent solder from spreading to the multilayer ceramic capacitor 100 in the length and width directions of the multilayer ceramic capacitor 100.

Therefore, the transfer of vibrations to the circuit board by the solder may be further reduced.

Figure 7:
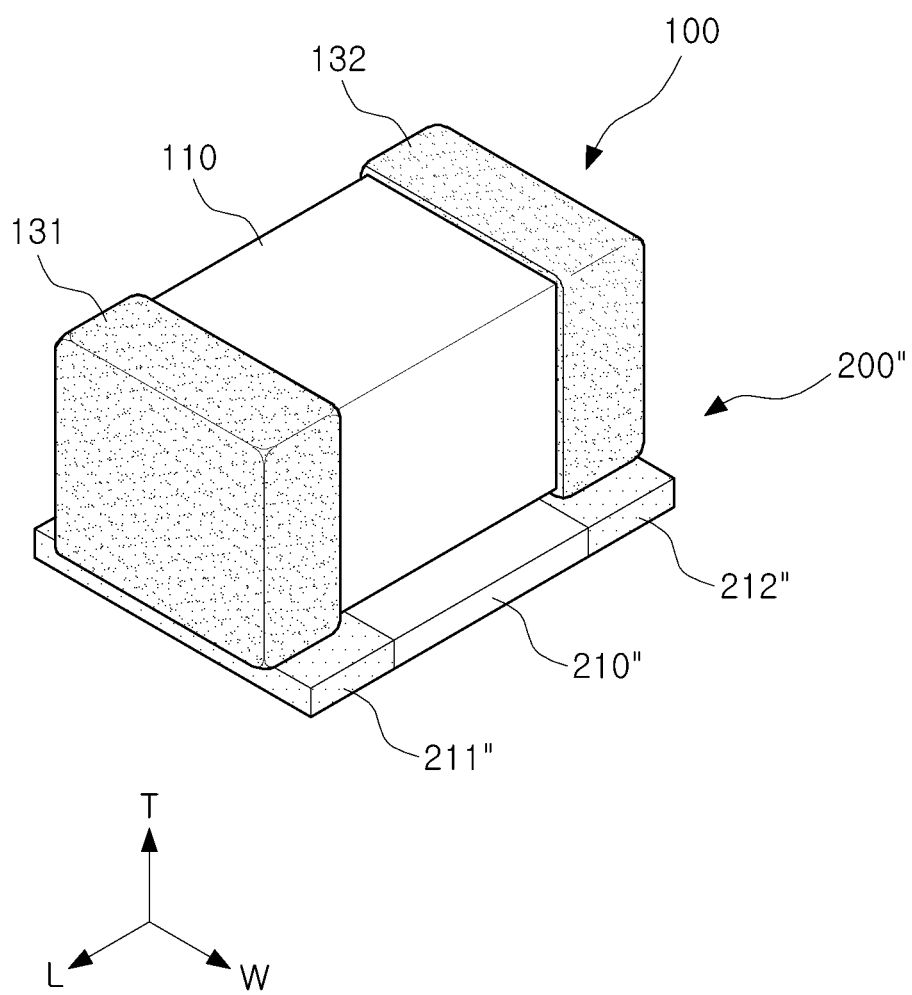
FIG. 7 is a perspective view schematically illustrating a composite electronic component according to another exemplary embodiment in the present disclosure.

FIG. 7 is a perspective view schematically illustrating a composite electronic component according to another exemplary embodiment.

Referring to FIG. 7, in the composite electronic component, according to another exemplary embodiment, a ceramic electronic component 200″ may be shorter than a multilayer ceramic capacitor 100, and the ceramic electronic component 200″ may be wider than the multilayer ceramic capacitor 100.

The ceramic electronic component 200″ may include a second ceramic body 210″ formed of ceramic and first and second terminal electrodes 211″ and 212″ disposed on both end portions of the second ceramic body 210″ and connected to the first and second external electrodes 131 and 132.

Since the ceramic electronic component 200″ is shorter than the multilayer ceramic capacitor 100, and the ceramic electronic component 200″ is wider than the multilayer ceramic capacitor 100, when the composite electronic component is mounted on a printed circuit board, solders may be applied to only the lower surfaces of the first and second external electrodes 131 and 132 in the length direction of the multilayer ceramic capacitor 100, and the solders may be prevented from spreading to the multilayer ceramic capacitor 100 due to a step portion in a width direction thereof.

Therefore, the transfer of vibrations to the board by the solder may be further reduced.

Figure 8:
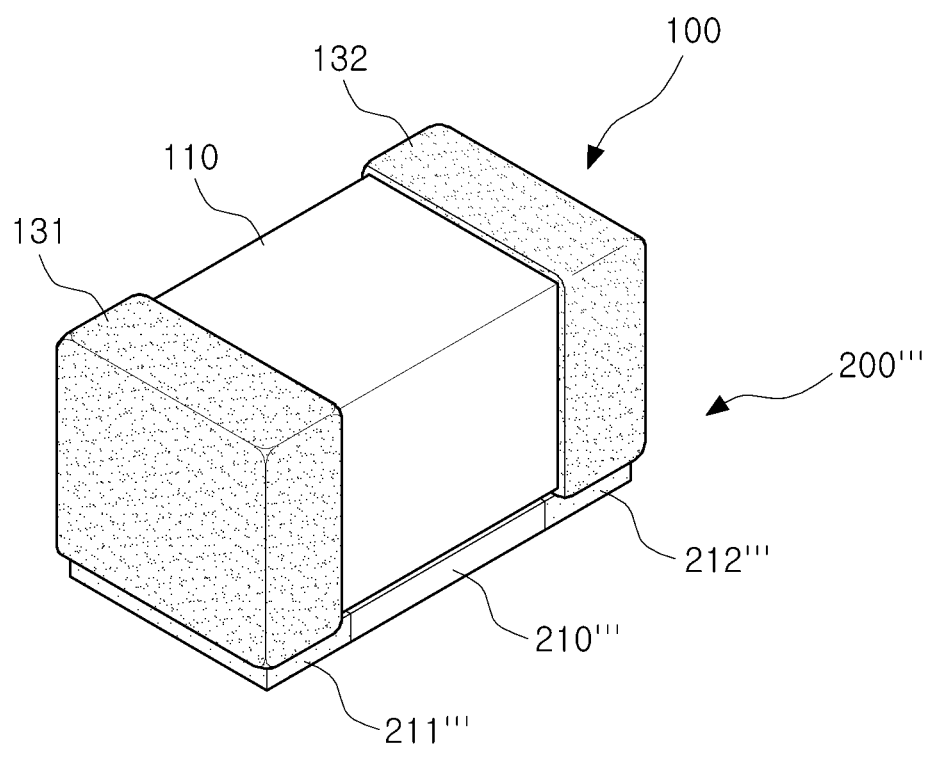
FIG. 8 is a perspective view schematically illustrating a composite electronic component according to another exemplary embodiment in the present disclosure.
Figure 8:
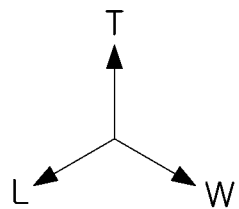

FIG. 8 is a perspective view schematically illustrating a composite electronic component according to another exemplary embodiment.

Referring to FIG. 8, in the composite electronic component, according to another exemplary embodiment, a ceramic electronic component 200‴ may be shorter than the multilayer ceramic capacitor 100, and the ceramic electronic component 200‴ may be narrower than the multilayer ceramic capacitor 100.

The ceramic electronic component 200‴ may include a second ceramic body 210‴ formed of ceramic and first and second terminal electrodes 211‴ and 212‴ disposed on both end portions of the second ceramic body 210‴ and connected to the first and second external electrodes 131 and 132.

Since the ceramic electronic component 200‴ is shorter than the multilayer ceramic capacitor 100, and the ceramic electronic component 200‴ is narrower than the multilayer ceramic capacitor 100, when the composite electronic component is mounted on a printed circuit board, solder may be applied to only the lower surfaces of the first and second external electrodes 131 and 132 in the length and width directions of the multilayer ceramic capacitor 100, and the solder may be prevented from spreading to the multilayer ceramic capacitor 100 in the thickness direction thereof.

Therefore, the transfer of vibrations to the board by the solder may be further reduced.

Board Having Composite Electronic Component

Figure 9:
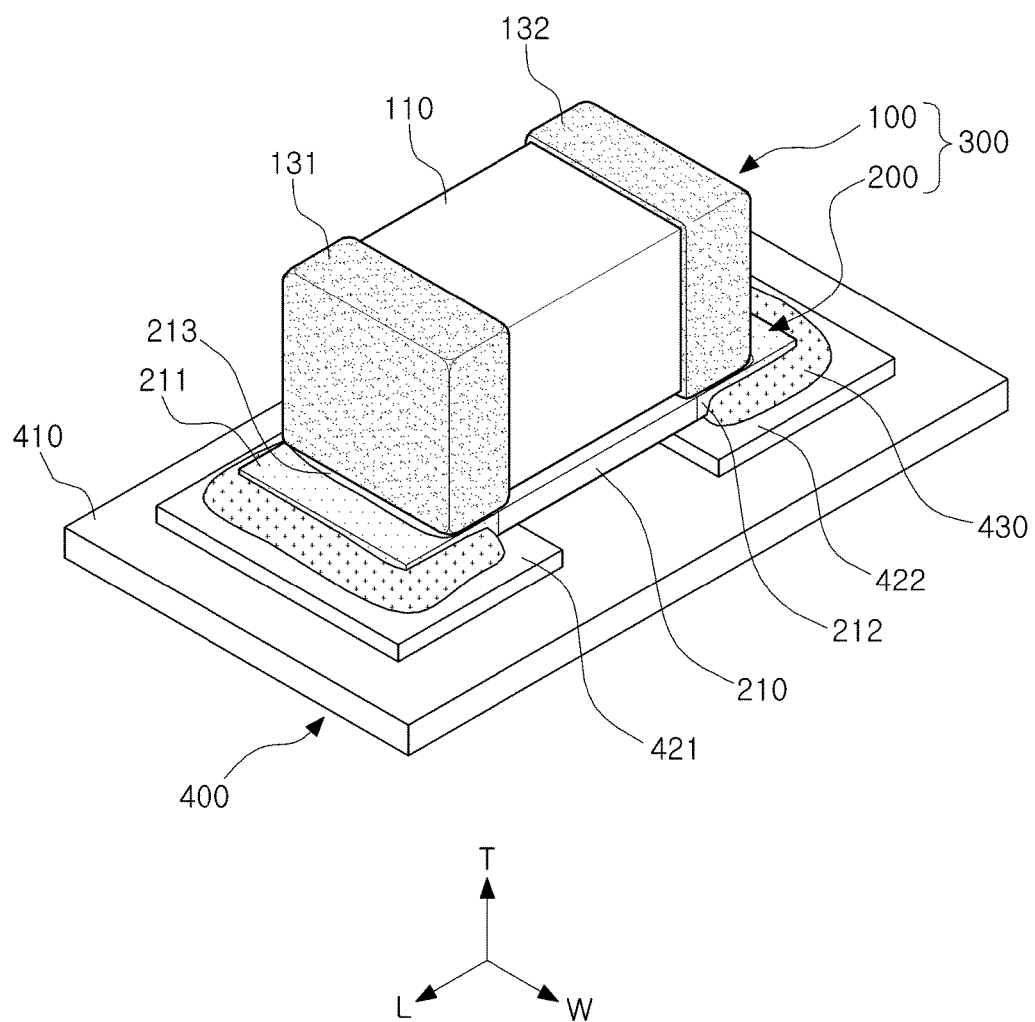
FIG. 9 is a perspective view illustrating a board in which the composite electronic component of FIG. 1 is mounted on a printed circuit board.

FIG. 9 is a perspective view illustrating a board in which the composite electronic component of FIG. 1 is mounted on a printed circuit board.

Figure 10:
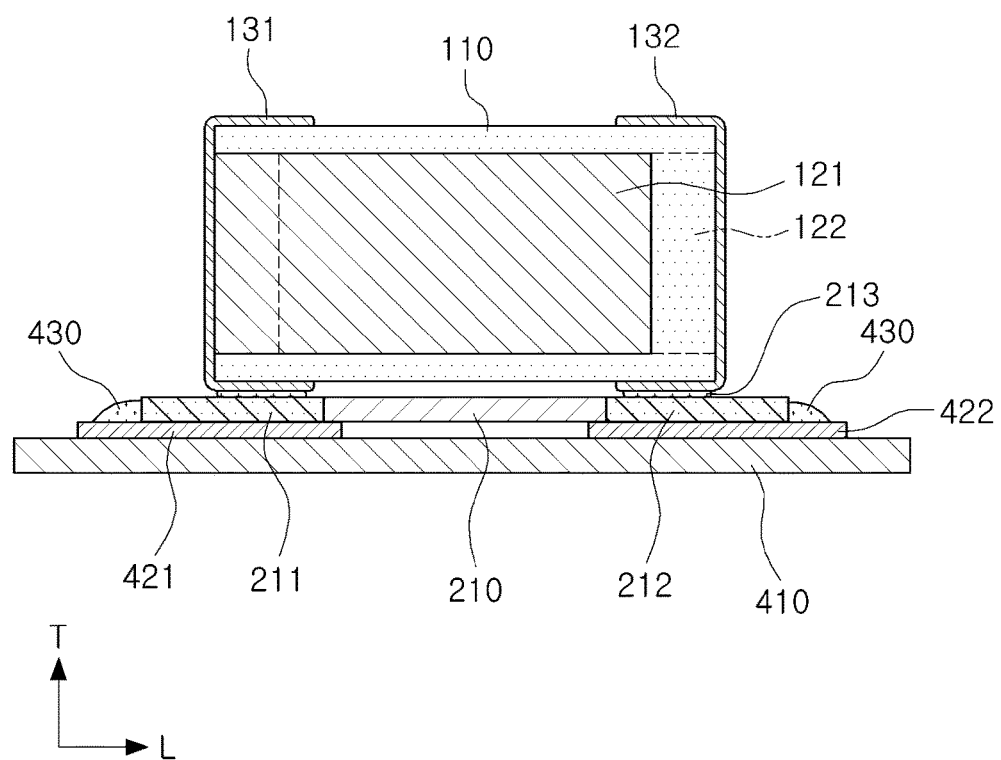
FIG. 10 is a cross-sectional view, taken in a length direction, of a board in which the composite electronic component of FIG. 9 is mounted on a circuit board.

FIG. 10 is a cross-sectional view, taken in a length direction, of a board in which the composite electronic component of FIG. 9 is mounted on a printed circuit board.

Referring to FIGS. 9 and 10, a board 400, according to the exemplary embodiment, may include a composite electronic component, a printed circuit board 410 on which the composite electronic component is mounted, and two electrode pads 421 and 422 formed on an upper surface of the printed circuit board 410.

The electrode pads 421 and 422 may include first and second electrode pads 421 and 422 connected to the first and second terminal electrodes 211 and 212 of the ceramic electronic component 200 of the composite electronic component, respectively.

In this case, the first and second terminal electrodes 211 and 212 may be electrically connected to the printed circuit board 410 by solders 430 in a state in which first and second terminal electrodes 211 and 212 are positioned to contact the first and second electrode pads 421 and 422, respectively.

When voltage is applied to the board 400 in a state in which the composite electronic component is mounted on the printed circuit board 410 as described above, acoustic noise may be generated.

That is, when voltages having different polarities are applied to the first and second external electrodes 131 and 132 disposed on both end surfaces of the multilayer ceramic capacitor 100 of the composite electronic component in the length direction in a state in which the composite electronic component is mounted on the printed circuit board 410, the first ceramic body may be expanded and contracted in the thickness direction by an inverse piezoelectric effect of the dielectric layers 111, and both side portions of the first and second external electrodes 131 and 132 may be contracted and expanded by the Poisson effect as opposed to expansion and contraction of the first ceramic body 110 in the thickness direction.

Here, by manufacturing the multilayer ceramic capacitor 100 and the ceramic electronic component 200 to have different lengths, in a manner such that the ceramic electronic component 200 is longer than the multilayer ceramic capacitor 100, even when a large amount of solder is used at the time of mounting the composite electronic component on the printed circuit board, the spreading of solder around the first and second external electrodes 131 and 132 of the multilayer ceramic capacitor 100 may be prevented. Thus, piezoelectric stress may be prevented from being directly transferred from the multilayer ceramic capacitor 100 to the printed circuit board through the first and second external electrodes 131 and 132. Therefore, acoustic noise may be further decreased.

That is, the acoustic noise may be reduced by decreasing the transfer of vibrations of the capacitor by the inverse piezoelectric properties of the capacitor to the board at the time of mounting the composite electronic component on the board.

Figure 11:
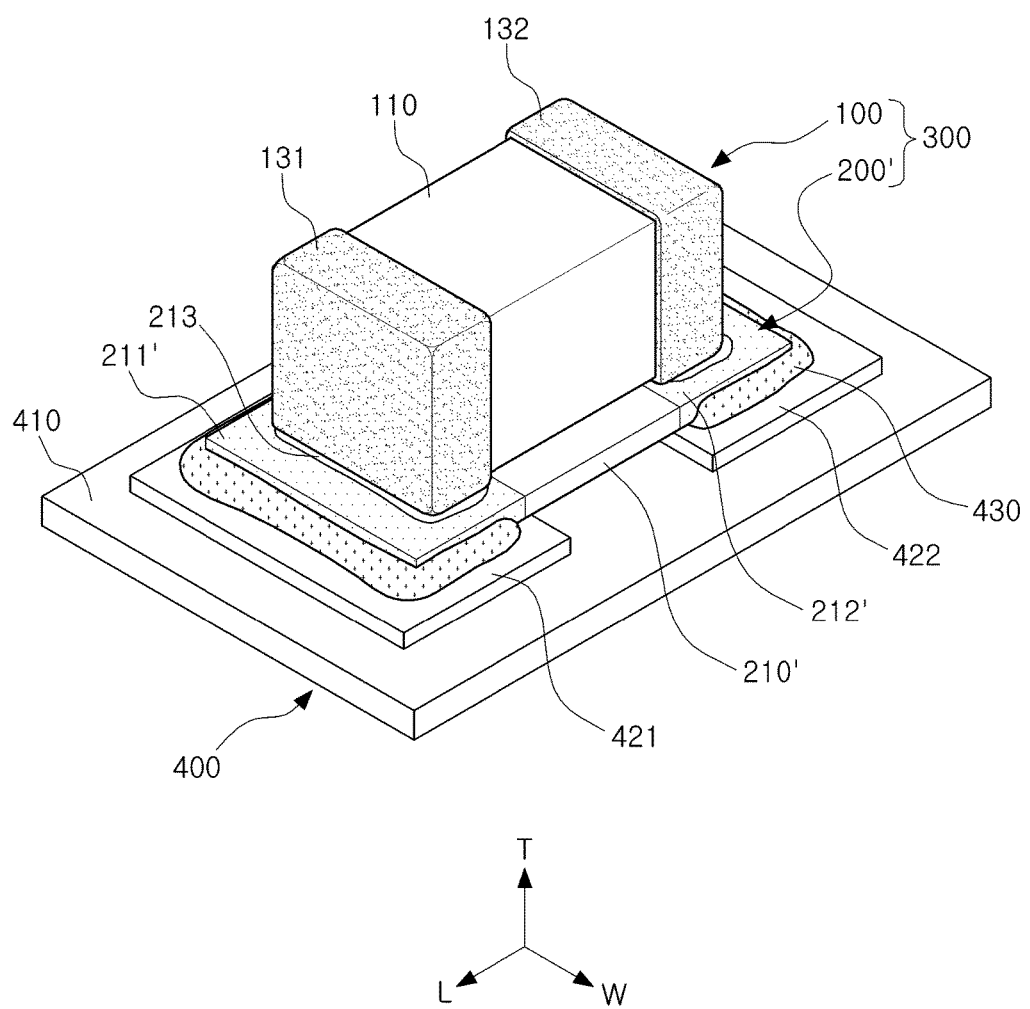
FIG. 11 is a perspective view illustrating a board in which the composite electronic component of FIG. 6 is mounted on a printed circuit board.

FIG. 11 is a perspective view illustrating a board in which the composite electronic component of FIG. 6 is mounted on a printed circuit board.

Figure 12:
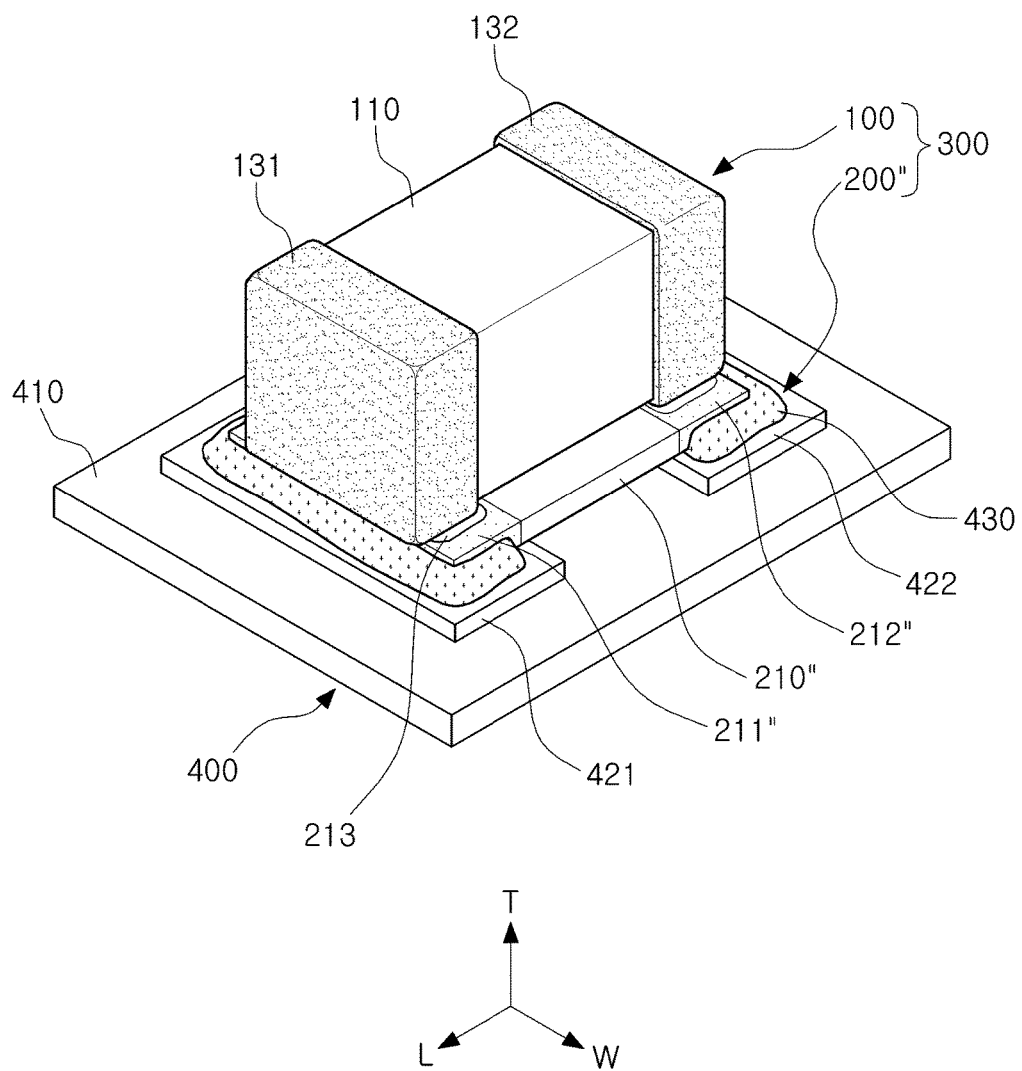
FIG. 12 is a perspective view illustrating a board in which the composite electronic component of FIG. 7 is mounted on a printed circuit board.

FIG. 12 is a perspective view illustrating a board in which the composite electronic component of FIG. 7 is mounted on a printed circuit board.

Figure 13:
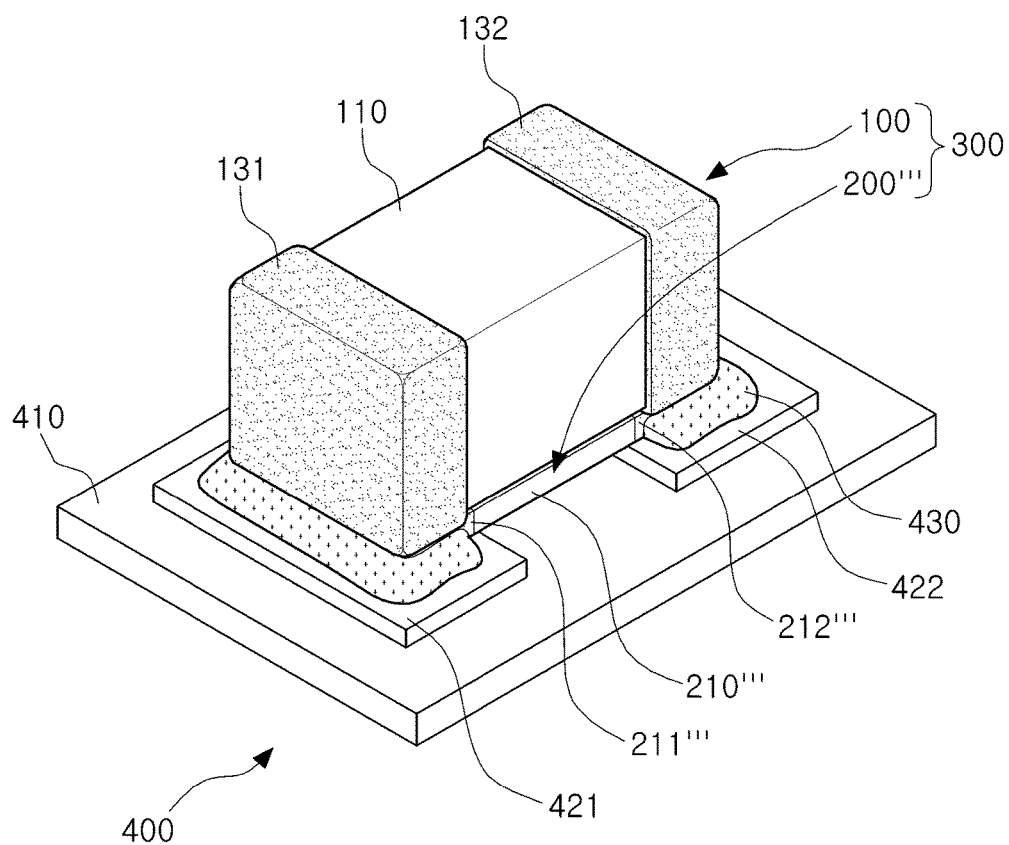
FIG. 13 is a perspective view illustrating a board in which the composite electronic component of FIG. 8 is mounted on a printed circuit board.

FIG. 13 is a perspective view illustrating a board in which the composite electronic component of FIG. 8 is mounted on a printed circuit board.

FIGS. 11 through 13 are perspective views illustrating boards, according to other exemplary embodiments, in which the composite electronic components illustrated in FIGS. 6 through 8 are mounted on printed circuit boards. Since descriptions of the composite electronic components and the boards having the same are the same as those of the above-mentioned composite electronic component and the board having the same according to the previous exemplary embodiment, detailed descriptions thereof will be omitted in order to avoid redundancy.

Packing Unit for Composite Electronic Components

Figure 14:
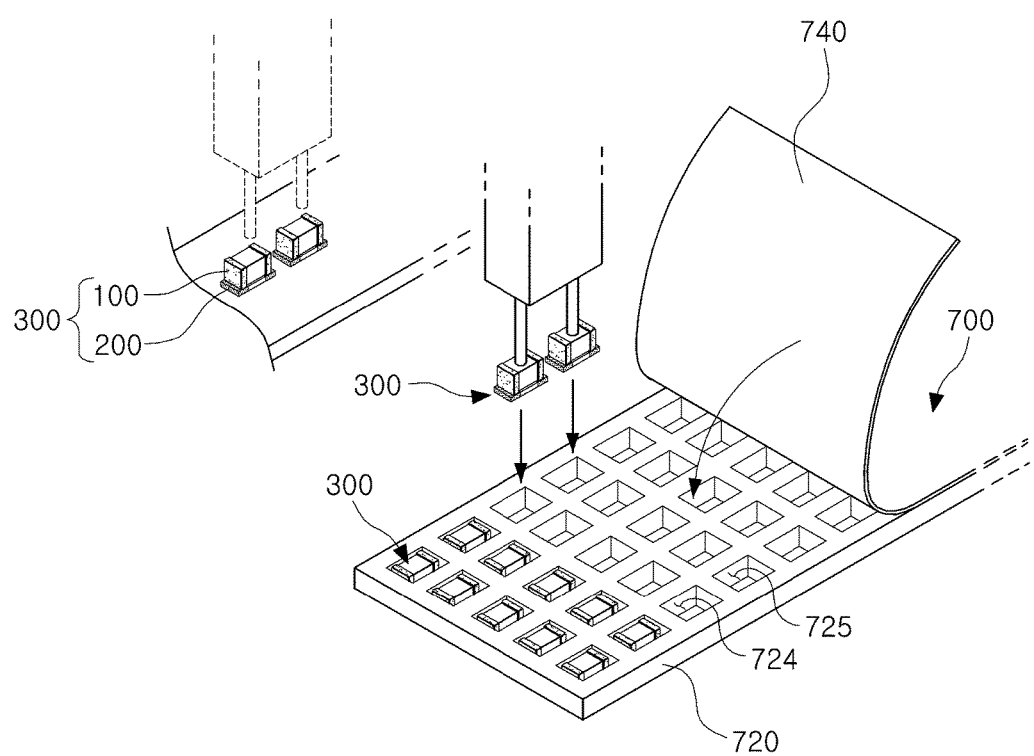
FIG. 14 is a schematic perspective view illustrating a packing unit in which the composite electronic components of FIG. 1 are mounted.

FIG. 14 is a schematic perspective view illustrating a packing unit in which the composite electronic components of FIG. 1 are mounted.

Figure 15:
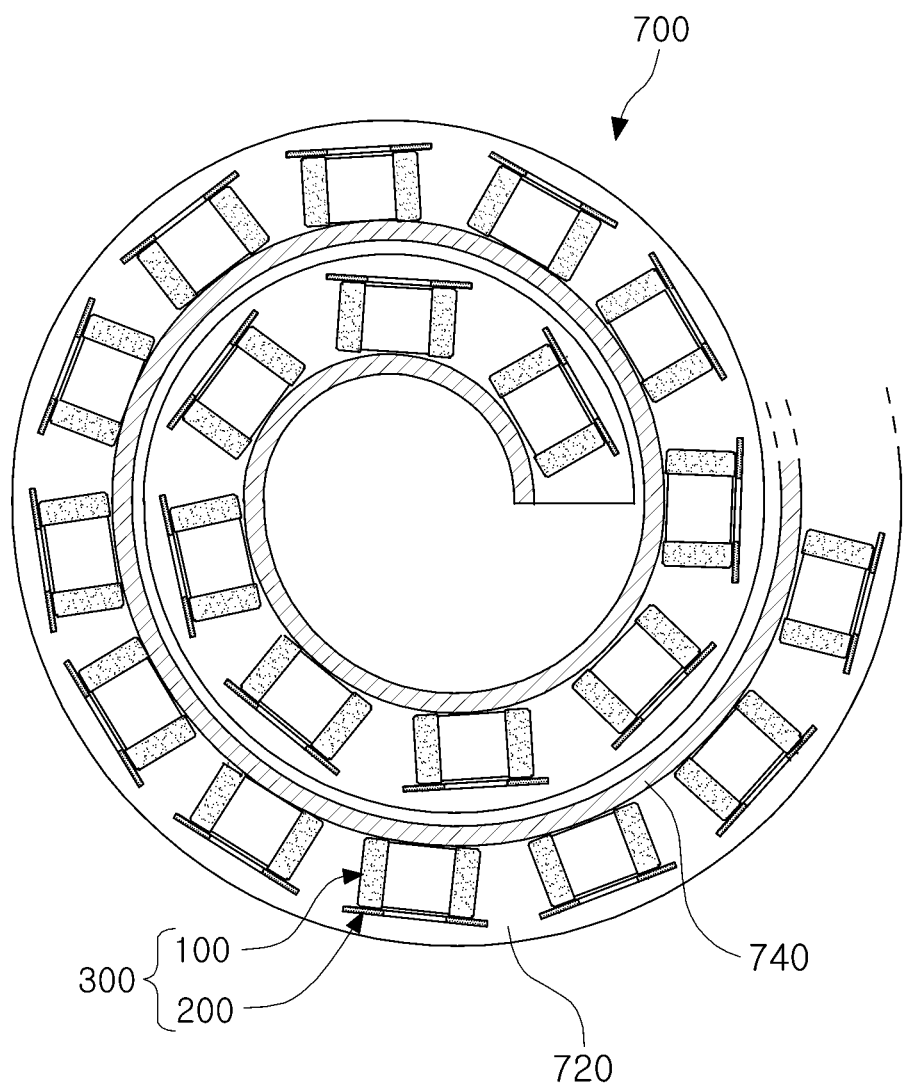
FIG. 15 is a schematic cross-sectional view illustrating the packing unit of FIG. 14 wound in a reel shape.

FIG. 15 is a schematic cross-sectional view illustrating the packing unit of FIG. 14 wound in a reel shape.

Referring to FIG. 15, a packing unit 700, according to the exemplary embodiment, may include a packing sheet 720 having accommodation parts 724 formed therein, the accommodation parts 724 accommodating the composite electronic components therein.

A shape of the accommodation part 724 of the packing sheet 720 may correspond to that of the composite electronic component. The internal electrodes may be disposed perpendicularly to a bottom surface 725 of the accommodation part 724.

In particular, each composite electronic component accommodated in the accommodation part 724 may be disposed to allow the ceramic electronic component 200 to face the bottom surface of the accommodation part 724.

The composite electronic components may be moved to the packing sheet 720 through a transfer device while maintaining a state in which the internal electrodes are arranged perpendicularly to the bottom surface of the accommodation part 724 through an electronic component arrangement device.

Through the above-mentioned method, the plurality of composite electronic components in the packing sheet 720 may be disposed to have the same directionality in the packing sheet 720.

The packing unit 700 may further include a packing film 740 covering the packing sheet 720 in which the composite electronic components are accommodated therein such that the internal electrodes are disposed perpendicularly to the bottom surface 725 of the accommodation part 724 and the ceramic electronic component 200 is disposed to face the bottom surface of the accommodation part 724.

The packing unit 700 illustrated in FIG. 15 may be continuously wound in a reel shape.

Figure 16:
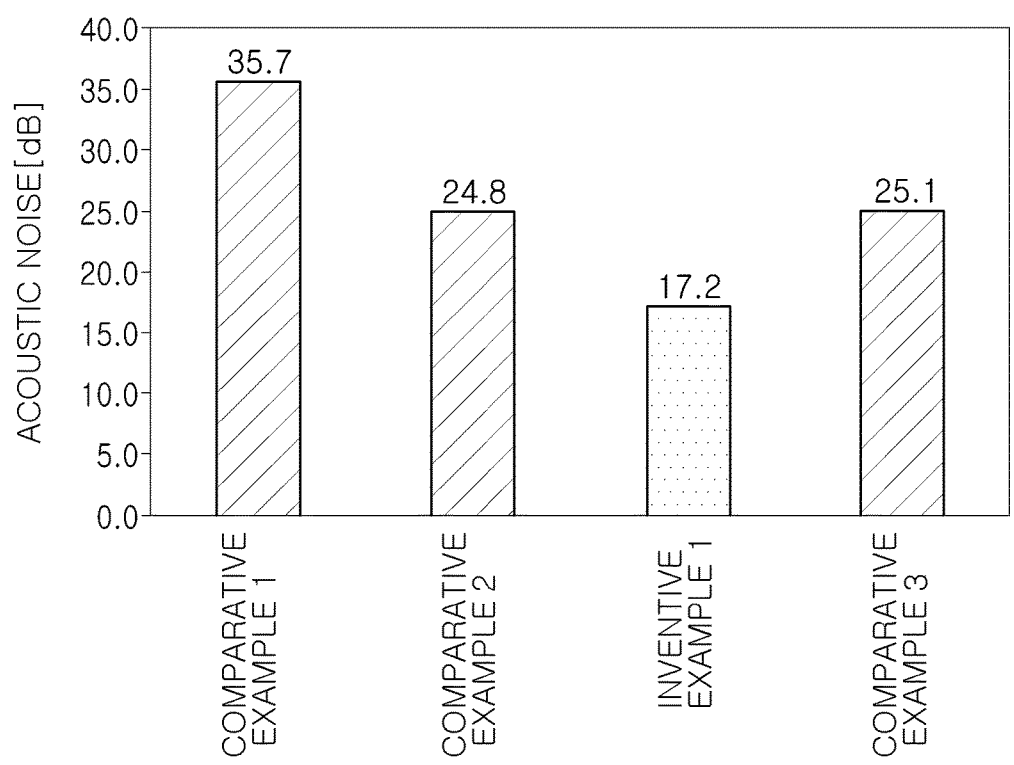
FIG. 16 is a graph illustrating the comparison results of acoustic noise according to Inventive and Comparative Examples.

FIG. 16 is a graph illustrating the comparison results of acoustic noise according to Inventive and Comparative Examples.

Referring to FIG. 16, results obtained by comparing acoustic noise according to the Inventive and Comparative Examples may be appreciated.

In FIG. 16, the Comparative Examples are as follows: Comparative Example 1 corresponds to a general multilayer ceramic capacitor; Comparative Example 2 corresponds to a composite electronic component in which a ceramic electronic component formed of a paraelectric material is bonded to a lower portion of a multilayer ceramic capacitor as in the Inventive Example, but internal electrodes of the multilayer ceramic capacitor are disposed in parallel with a mounting surface of the multilayer ceramic capacitor; and Comparative Example 3 corresponds to a multilayer ceramic capacitor in which a lower cover layer of a ceramic body is thicker than an upper cover layer thereof.

In addition, Inventive Example 1 corresponds to a composite electronic component in which a ceramic electronic component formed of a paraelectric material is bonded to a lower portion of the multilayer ceramic capacitor.

Referring to FIG. 16, it may be appreciated that in Inventive Example 1 corresponding to the composite electronic component in which the ceramic electronic component formed of the paraelectric material is bonded to the lower portion of the multilayer ceramic capacitor, an acoustic noise value is significantly low as compared to Comparative Examples 1 to 3.

Figure 17:
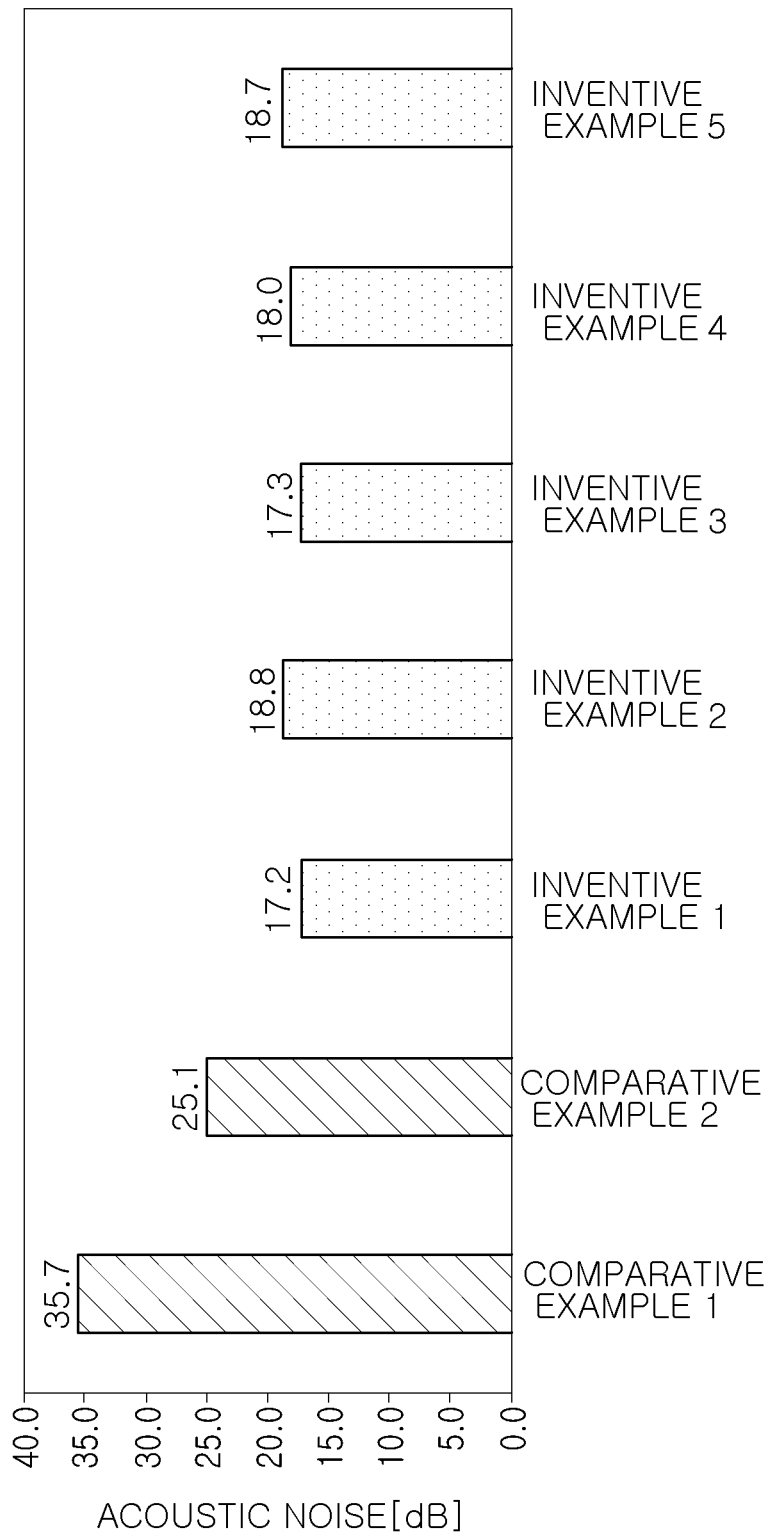
FIG. 17 is a graph illustrating the comparison results of acoustic noise according to Inventive and Comparative Examples.

FIG. 17 is a graph illustrating the comparison results of acoustic noise according to Inventive and Comparative Examples.

In FIG. 17, Comparative Example 1 corresponds to a general multilayer ceramic capacitor, and Comparative Example 2 corresponds to a multilayer ceramic capacitor in which a lower cover layer of a ceramic body is thicker than an upper cover layer thereof.

In addition, Inventive Example 1 corresponds to a composite electronic component in which a ceramic electronic component formed of a paraelectric material is bonded to a lower portion of a multilayer ceramic capacitor, and Inventive Examples 2 to 5 correspond to composite electronic components, each of which having a structure in which a ceramic electronic component formed of ceramic containing alumina ($Al_2O_3$) is bonded to a lower portion of a multilayer ceramic capacitor.

Inventive Examples 2 to 5 correspond to cases in which thicknesses of the ceramic electronic components are 0.1 mm, 0.2 mm, 0.3 mm, and 0.4 mm, respectively.

Referring to FIG. 17, it may be appreciated that in Inventive Example 1 corresponding to the composite electronic component in which the ceramic electronic component formed of the paraelectric material is bonded to the lower portion of the multilayer ceramic capacitor, an effect of decreasing acoustic noise is excellent.

Further, it may be appreciated that in Inventive Examples 2 to 5 corresponding to the composite electronic components in which the ceramic electronic component formed of ceramic containing alumina ($Al_2O_3$) is bonded to the lower portion of the multilayer ceramic capacitor, the effect of decreasing acoustic noise is improved in comparison to Comparative Examples 1 and 2.

As set forth above, according to exemplary embodiments in the present disclosure, stress or vibrations due to the piezoelectric properties of the multilayer ceramic capacitor may be alleviated by the ceramic electronic component, whereby the intensity of the acoustic noise generated in the circuit board may be reduced.

Further, the internal electrodes of the multilayer ceramic capacitor may be stacked perpendicularly to the mounting surface, and the length-width surface thereof in which a piezoelectric displacement amount is small may be adhered to the ceramic electronic component, whereby acoustic noise may be reduced by significantly decreasing the transfer of stress and vibrations generated in the multilayer ceramic capacitor to the ceramic electronic component.

In addition, step portions may be formed between the multilayer ceramic capacitor and the ceramic electronic component, thereby preventing the solder from being formed in the thickness direction of the multilayer ceramic capacitor, whereby the transfer of vibrations to the board by the solder may be significantly reduced.

Further, when mechanical stress is applied, the ceramic electronic component and the conductive resin layers used as the terminal electrodes of the ceramic electronic component may prevent the stress from being transferred to the multilayer ceramic capacitor, thereby preventing the multilayer ceramic capacitor from being damaged by cracks.

While exemplary embodiments have been shown and described above, it will be apparent to those skilled in the art that modifications and variations could be made without departing from the scope of the present invention as defined by the appended claims.

What is claimed is:

1. A composite electronic component comprising a composite body in which a multilayer ceramic capacitor and a ceramic electronic component are coupled to each other,
wherein the multilayer ceramic capacitor includes:
a first ceramic body comprising dielectric layers and internal electrodes, the internal electrodes having at least one of the dielectric layers interposed therebetween; and
first and second external electrodes disposed on first and second end portions of the first ceramic body in a length direction,
the ceramic electronic component comprises:
a second ceramic body coupled to a lower portion of the multilayer ceramic capacitor, and made of ceramic containing alumina ($Al_2O_3$) or a paraelectric material represented by $(Ca_{1-x}Sr_x)(Zr_{1-y}Ti_y)O_3$, $Ca(Zr_{1-y}Ti_y)O_3$, $Sr(Zr_{1-y}Ti_y)O_3$, $(Ca_{1-x}Sr_x)ZrO_3$, and $(Ca_{1-x}Sr_x)TiO_3$; and
first and second terminal electrodes disposed on first and second end portions of the second ceramic body in the length direction and connected to the first and second external electrodes,
the multilayer ceramic capacitor and the ceramic electronic component have different lengths in the length direction,
the first terminal electrode entirely covers a first end surface of the second ceramic body, and extends from the first end surface of the second ceramic body to first and second side surfaces of the second ceramic body in a width direction and to upper and lower surfaces of the second ceramic body, and
the second terminal electrode entirely covers a second end surface of the second ceramic body, and extends from the second end surface of the second ceramic body to the first and second side surfaces of the second ceramic body in the width direction and to the upper and lower surfaces of the second ceramic body, the first and second end surfaces of the second ceramic body opposing each other in the length direction.

2. The composite electronic component of claim 1, wherein the internal electrodes are perpendicular to a mounting surface of the composite body.

3. The composite electronic component of claim 1, wherein the multilayer ceramic capacitor and the ceramic electronic component are coupled to each other by a conductive adhesive disposed on lower surfaces of the first and second external electrodes.

4. The composite electronic component of claim 1, wherein the multilayer ceramic capacitor and the ceramic electronic component are coupled to each other by an insulating adhesive disposed on a lower surface of the first ceramic body and the upper surface of the second ceramic body.

5. The composite electronic component of claim 1, wherein the first and second terminal electrodes have a double layer structure including a conductive resin layer disposed on the ceramic body and a plating layer disposed on the conductive resin layer.

6. The composite electronic component of claim 5, wherein the conductive resin layer contains silver (Ag) and an epoxy resin.

7. The composite electronic component of claim 1, wherein the ceramic electronic component is longer than the multilayer ceramic capacitor in the length direction.

8. The composite electronic component of claim 7, wherein the ceramic electronic component is wider than the multilayer ceramic capacitor in the width direction.

9. The composite electronic component of claim 1, wherein the ceramic electronic component is shorter than the multilayer ceramic capacitor in the length direction.

10. The composite electronic component of claim 1, wherein the ceramic electronic component is shorter than the multilayer ceramic capacitor in the length direction, and
the ceramic electronic component is narrower than the multilayer ceramic capacitor in the width direction.

11. A board comprising:
a printed circuit board having electrode pads;
a composite electronic component mounted on the printed circuit board; and
first and second solders connecting the electrode pads and the composite electronic component to each other,
wherein the composite electronic component includes a composite body in which a multilayer ceramic capacitor and a ceramic electronic component are coupled to each other,
the multilayer ceramic capacitor includes:
a first ceramic body comprising dielectric layers and internal electrodes, the internal electrodes having at least one of the dielectric layers interposed therebetween; and
first and second external electrodes disposed on first and second end portions of the first ceramic body in a length direction,
the ceramic electronic component comprises:
a second ceramic body coupled to a lower portion of the multilayer ceramic capacitor, and made of ceramic containing alumina ($Al_2O_3$) or a paraelectric material represented by $(Ca_{1-x}Sr_x)(Zr_{1-y}Ti_y)O_3$, $Ca(Zr_{1-y}Ti_y)O_3$, $Sr(Zr_{1-y}Ti_y)O_3$, $(Ca_{1-x}Sr_x)ZrO_3$, and $(Ca_{1-x}Sr_x)TiO_3$; and
first and second terminal electrodes disposed on first and second end portions of the second ceramic body in the length direction and connected to the first and second external electrodes,
the multilayer ceramic capacitor and the ceramic electronic component have different lengths in the length direction,
the first terminal electrode entirely covers a first end surface of the second ceramic body, and extends from the first end surface of the second ceramic body to first and second side surfaces of the second ceramic body in a width direction and to upper and lower surfaces of the second ceramic body, and
the second terminal electrode entirely covers a second end surface of the second ceramic body, and extends from the second end surface of the second ceramic body to the first and second side surfaces of the second ceramic body in the width direction and to the upper and lower surfaces of the second ceramic body, the first and second end surfaces of the second ceramic body opposing each other in the length direction.

12. The board of claim 11, wherein the first and second solders are disposed at least on first and second end surfaces of the first and second terminal electrodes in the length direction, respectively, and on lower portions of the first and second external electrodes, respectively.

13. The board of claim 11, wherein the internal electrodes are perpendicular to a mounting surface of the composite body.

14. The board of claim 11, wherein the first solder extends continuously between first and second side surfaces of the first terminal electrode in the width direction and covers a first end surface of the first terminal electrode connecting the first and second side surfaces of the first terminal electrode, and the second solder extends continuously between third and fourth side surfaces of the second terminal electrode in the width direction and covers a second end surface of the second terminal electrode connecting the third and fourth side surfaces of the second terminal electrode, the first end surface of the first terminal electrode and the second end surface of the second terminal electrode opposing each other in the length direction.

* * * * *